(12) United States Patent
Lee

(10) Patent No.: US 11,309,885 B2
(45) Date of Patent: Apr. 19, 2022

(54) POWER-ON RESET SIGNAL GENERATING DEVICE

(71) Applicant: SK hynix Inc., Icheon-si (KR)

(72) Inventor: Hyun Chul Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/918,832

(22) Filed: Jul. 1, 2020

(65) Prior Publication Data
US 2021/0167771 A1 Jun. 3, 2021

(30) Foreign Application Priority Data
Nov. 29, 2019 (KR) .................. 10-2019-0157542

(51) Int. Cl.
*H03K 17/22* (2006.01)
*H03K 17/16* (2006.01)
*G06F 1/24* (2006.01)

(52) U.S. Cl.
CPC .............. *H03K 17/223* (2013.01); *G06F 1/24* (2013.01); *H03K 17/162* (2013.01)

(58) Field of Classification Search
CPC ...... H03K 17/22; H03K 17/223; H03K 17/24; H03K 17/162; H03K 17/165; H03K 5/08; H03K 5/082; H03K 5/084; H03K 5/086; H03K 5/088; G06F 1/24; G06F 1/30; G06F 1/305
See application file for complete search history.

(56) References Cited

U.S. PATENT DOCUMENTS

| 5,825,220 A * | 10/1998 | Kinugasa ............. H03K 17/223 327/143 |
| 6,362,669 B1 | 3/2002 | Zhou et al. |
| 8,035,428 B2 * | 10/2011 | Kang ..................... H03K 17/20 327/143 |

FOREIGN PATENT DOCUMENTS

KR 100583097 B1 5/2006

* cited by examiner

*Primary Examiner* — Long Nguyen
(74) *Attorney, Agent, or Firm* — William Park & Associates Ltd.

(57) ABSTRACT

A power-on reset signal generating device includes a reference voltage generator, a signal driver, and a stabilization circuit. The reference voltage generator generates a power-on reference voltage based on a voltage level of a power supply voltage. The signal driver drives the power-on reference voltage to generate a power-on reset signal. The stabilization circuit receives the power-on reset signal to keep a voltage level of the power-on reference voltage staying during a predetermined amount of time.

10 Claims, 7 Drawing Sheets

POWER-ON RESET SIGNAL GENERATING DEVICE

CROSS-REFERENCES TO RELATED APPLICATION

The present application claims priority under 35 U.S.C. § 119(a) to Korean application number 10-2019-0157542, filed on Nov. 29, 2019, in the Korean Intellectual Property Office, which is incorporated herein by reference in its entirety as set forth in full.

BACKGROUND

1. Technical Field

Various embodiments generally relate to a semiconductor integrated circuit technology, and more particularly, to a power-on reset signal generating device.

2. Related Art

A semiconductor apparatus operates through a supply of a power supply voltage from an external power source. When the semiconductor apparatus is supplied with the power supply voltage, the semiconductor apparatus performs a power-up operation. When a voltage level of the power supply voltage becomes stable, the semiconductor apparatus enables a power-on reset signal. When the power-on reset signal is enabled, the semiconductor apparatus initializes internal circuits and prepares for a normal operation. When the supply of the power supply voltage to the semiconductor apparatus is interrupted, the semiconductor apparatus performs a power-down operation. When the voltage level of the power supply voltage falls under a predetermined level or a lower level, the semiconductor apparatus disables the power-on reset signal.

The semiconductor apparatus detects the level of the power supply voltage in order to generate the power-on reset signal. However, the power supply voltage provided from the external power source is inevitably accompanied by a noise. Therefore, during a period of the power-up or a period of the power-down, the voltage level of the power supply voltage stays around a target voltage level, which is a reference for stabilization, while iteratively fluctuating upward and downward with reference to the target voltage level.

Due to such noise of the power supply voltage, when the power supply voltage reaches a vicinity of the target voltage level, the power-on reset signal becomes enabled and/or disabled and then becomes disabled and/or enabled, which causes a glitch of the power-on reset signal. The glitch of the power-on reset signal causes a malfunction of the semiconductor apparatus.

SUMMARY

In accordance with an embodiment, a power-on reset signal generating device may include a reference voltage generator, a signal driver, and a stabilization circuit. The reference voltage generator may detect a voltage level of a power supply voltage to generate a power-on reference voltage. The signal driver may drive the power-on reference voltage to generate a power-on reset signal. The stabilization circuit may keep, when the power-on reset signal is enabled, the power-on reset signal enabled during a predetermined amount of time and may prevent, when the power-on reset signal is disabled, prevent the power-on reset signal from being enabled during the predetermined amount of time.

In accordance with an embodiment, a power-on reset signal generating device may include a reference voltage generator, a signal driver, and a stabilization circuit. The reference voltage generator may generate a power-on reference voltage based on a voltage level of a power supply voltage. The signal driver may drive the power-on reference voltage to generate a power-on reset signal. The stabilization circuit may receive the power-on reset signal, which is fed-back, to keep a voltage level of the power-on reference voltage maintained regardless of a voltage level fluctuation of the power supply voltage.

In accordance with an embodiment, a power-on reset signal generating device may include a reference voltage generator, a signal driver, and a stabilization circuit. The reference voltage generator may detect a voltage level of a power supply voltage to generate a power-on reference voltage. The signal driver may drive the power-on reference voltage to generate a power-on reset signal enabled when the power supply voltage is equal to or greater than a target voltage level. The stabilization circuit may maintain an enabled state of the power-on reset signal during a predetermined amount of time after the power-on reset signal transitions from a disabled state to the enabled state even though the power supply voltage is less than the target voltage level during the predetermined amount of time.

DETAILED DESCRIPTION

Figure 1:
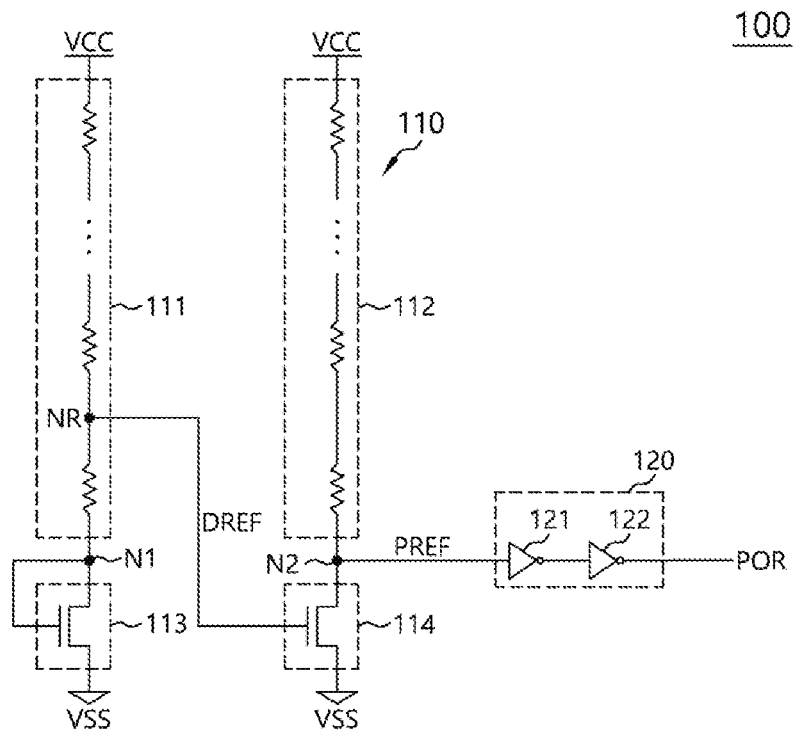
FIG. 1 is a diagram illustrating a configuration of a power-on reset signal generating device in accordance with an embodiment.

FIG. 1 is a diagram illustrating a configuration of a power-on reset signal generating device 100 in accordance with an embodiment. Referring to FIG. 1, the power-on reset signal generating device 100 may receive a power supply voltage VCC and may detect a voltage level of the power supply voltage VCC to generate a power-on reset signal POR. The power-on reset signal generating device 100 may detect a power-up state to enable the power-on reset signal POR and may detect a power-down state to disable the power-on reset signal POR. In the power-up state, the power supply voltage VCC may be supplied from an external power source and the voltage level of the power supply voltage VCC may rise to reach a target voltage level or a greater voltage level. When the voltage level of the power supply voltage VCC rises to reach the target voltage level or a greater voltage level, the voltage level of the power supply voltage VCC may be determined as stabilized. In the power-down state, the supply of the power supply voltage VCC from the external power source may be interrupted and the voltage level of the power supply voltage VCC may fall under the target voltage level. The power-on reset signal generating device 100 may enable the power-on reset signal POR when the voltage level of the power supply voltage VCC rises to reach the target voltage level or a greater voltage level. The power-on reset signal generating device 100 may maintain the power-on reset signal POR in an enabled state when the voltage level of the power supply voltage VCC stays at the target voltage level or at a greater voltage level. The power-on reset signal generating device 100 may disable the power-on reset signal POR to a disabled state when the voltage level of the power supply voltage VCC falls under the target voltage level.

The power-on reset signal generating device 100 may include a reference voltage generator 110 and a signal driver 120. The reference voltage generator 110 may detect the voltage level of the power supply voltage VCC to generate a power-on reference voltage PREF. When the voltage level of the power supply voltage VCC rises to reach the target voltage level or a higher voltage level, the reference voltage generator 110 may lower the power-on reference voltage PREF so that the voltage level of the power-on reference voltage PREF can be determined as a logic low level. When the voltage level of the power supply voltage VCC stays to the target voltage level or a greater voltage level, the reference voltage generator 110 may keep the power-on reference voltage PREF to the voltage level that can be determined as a logic low level of the power-on reference voltage PREF. When the voltage level of the power supply voltage VCC falls under the target voltage level, the reference voltage generator 110 may change the power-on reference voltage PREF so that the voltage level of the power-on reference voltage PREF can be determined as a logic high level. The reference voltage generator 110 may voltage-divide the power supply voltage VCC through a plurality of resistances to generate a detection voltage DREF from one or more of the divided voltages. The reference voltage generator 110 may drive the power-on reference voltage PREF by a ground voltage when a voltage level of the detection voltage DREF becomes the target voltage level or a greater voltage level. The reference voltage generator 110 may drive the power-on reference voltage PREF to the power supply voltage VCC when the voltage level of the detection voltage DREF becomes lower than the target voltage level.

The signal driver 120 may receive the power-on reference voltage PREF to generate the power-on reset signal POR. The signal driver 120 may drive the power-on reference voltage PREF to generate the power-on reset signal POR. In an embodiment, the signal driver 120 may non-inversion-drive the power-on reference voltage PREF to generate the power-on reset signal POR. For example, the signal driver 120 may include an even number of inverters and may sequentially inversion-drive the power-on reference voltage PREF through the even number of inverters to generate the power-on reset signal POR. For example, the signal driver 120 may include a first inverter 121 and a second inverter 122, as illustrated in FIG. 1. The first inverter 121 may receive the power-on reference voltage PREF, may invert the power-on reference voltage PREF and may output the inverted power-on reference voltage PREF. The second inverter 122 may receive the output of the first inverter 121, may invert the output of the first inverter 121 and may output the power-on reset signal POR. In an embodiment, the signal driver 120 may include an odd number of inverters to inversion-drive the power-on reference voltage PREF to generate the power-on reset signal POR. In this case, the power-on reset signal POR output from the signal driver 120 may be enabled to the other logic level.

The reference voltage generator 110 may include a first voltage divider 111, a second voltage divider 112, a diode transistor 113 and a trigger transistor 114. The first voltage divider 111 and the second voltage divider 112 may have the same configuration as each other. The first voltage divider 111 may include a plurality of resistors coupled in series between a node, to which the power supply voltage VCC is supplied, and a first node N1. The plurality of resistors may have the same resistance value as one another. The detection voltage DREF may be output from a node NR between any two resistors among the plurality of resistors serially coupled to each other. The location between two resistors for specifying the node NR may be arbitrarily selected to change the target voltage level. For example, as two selected resistors are closer to the node to which the power supply voltage VCC is supplied, the target voltage level may become higher. On the contrary, as two selected resistors are closer to the first node N1, the target voltage level may become lower. The diode transistor 113 may be coupled between the first node N1 and a node, to which a ground voltage VSS is supplied. For example, the diode transistor 113 may be a N-channel MOS transistor. The diode transistor 113 may be coupled to the first node N1 at its gate and drain, and may be coupled to the node, to which the ground voltage VSS is supplied, at its source. The diode transistor 113 may allow a steady amount of current to run from the first node N1 and the node, to which the ground voltage VSS is supplied.

The second voltage divider 112 may include a plurality of resistors coupled in series between the node, to which the power supply voltage VCC is supplied, and a second node N2. A number of the resistors included in the second voltage divider 112 may be the same as a number of resistors included in the first voltage divider 111. A resistance value of each of the resistors included in the second voltage divider 112 may be the same as the resistance value of each of the resistors included in the first voltage divider 111. The power-on reference voltage PREF may be output from the second node N2. The trigger transistor 114 may be coupled between the second node N2 and the node, to which the ground voltage VSS is supplied. The trigger transistor 114 may receive the detection voltage DREF. For example, the trigger transistor 114 may be a N-channel MOS transistor. The trigger transistor 114 may receive the detection voltage DREF at its gate, may be coupled to the second node N2 at its drain and may be coupled to the node, to which the ground voltage VSS is supplied, at its source. When the detection voltage DREF has a voltage level high enough to turn on the trigger transistor 114, the trigger transistor 114 may be turned on and the power-on reference voltage PREF may be driven to the ground voltage VSS. When the detection voltage DREF has a voltage level low not enough to turn on the trigger transistor 114, the trigger transistor 114 may be turned off and the power-on reference voltage PREF may be driven by power supply voltage VCC.

Figure 2:
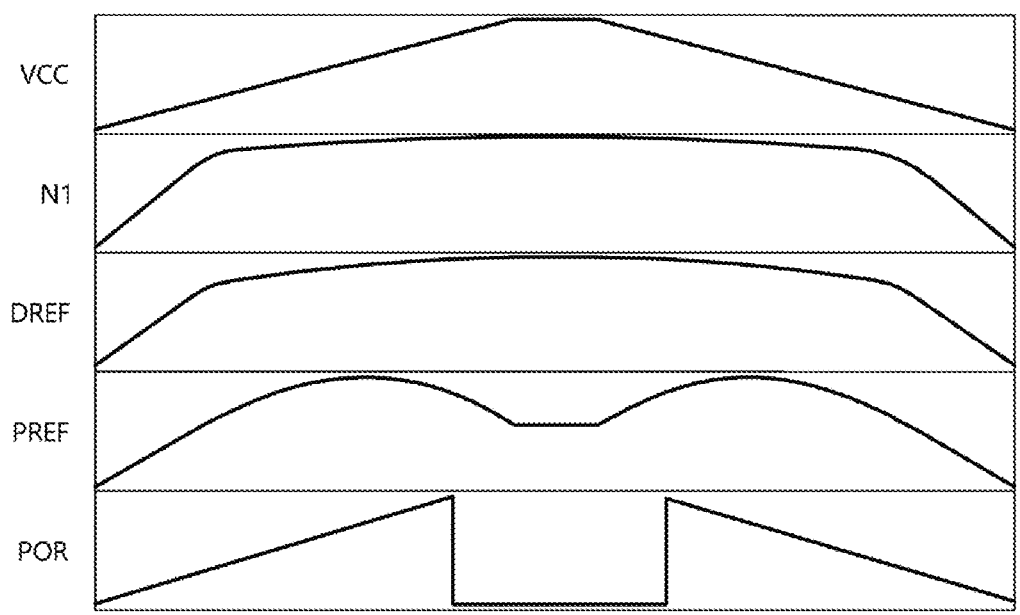
FIG. 2 is a diagram illustrating an operation of the power-on reset signal generating device illustrated in FIG. 1.

FIG. 2 is a diagram illustrating an operation of the power-on reset signal generating device 100 illustrated in FIG. 1. Described hereinafter with reference to FIGS. 1 and 2 will be the operation of the power-on reset signal generating device 100. When the power supply voltage VCC is supplied from the external power source, the voltage level of the power supply voltage VCC may become gradually higher. As the voltage level of the power supply voltage VCC becomes gradually higher, the voltage levels of the first node N1, the detection voltage DREF and the power-on reference voltage PREF may rise. As the voltage level of the detection voltage DREF rises, the amount of current running through the trigger transistor 114 may become greater. As the voltage level of the power-on reference voltage PREF rises, the voltage level of the power-on reset signal POR may rise. When the trigger transistor 114 becomes fully turned on as the voltage level of the detection voltage DREF rises, the voltage level of the power-on reference voltage PREF may fall. When the voltage level of the power-on reference voltage PREF falls under the threshold voltage of the first inverter 121, the power-on reset signal POR may be enabled to a logic low level. When the voltage level of the power supply voltage VCC is maintained, the amount of current running through the trigger transistor 114 may be maintained and thus the voltage level of the power-on reference voltage PREF may be maintained and the power-on reset signal POR may stay enabled.

When the supply of the power supply voltage VCC from the external power source is interrupted, the voltage level of the power supply voltage VCC may gradually fall. As the voltage level of the power supply voltage VCC gradually falls, the voltage level of the detection voltage DREF falls and the amount of current running through the trigger transistor 114 may become less. Therefore, the voltage level of the power-on reference voltage PREF may rise. When the voltage level of the power-on reference voltage PREF rises to reach the threshold voltage of the first inverter 121 or a greater voltage level as the voltage level of the detection voltage DREF falls, the power-on reset signal POR may be disabled to a logic high level. Then, as the voltage level of the power supply voltage VCC falls, the voltage levels of the detection voltage DREF, the power-on reference voltage PREF and the power-on reset signal POR may fall. When the voltage level of the power supply voltage VCC rises to reach the target voltage level or a greater voltage level, the power-on reset signal generating device 100 may enable the power-on reset signal POR to a logic low level. When the voltage level of the power supply voltage VCC falls under the target voltage level, the power-on reset signal generating device 100 may disable the power-on reset signal POR to a logic high level.

Figure 3:
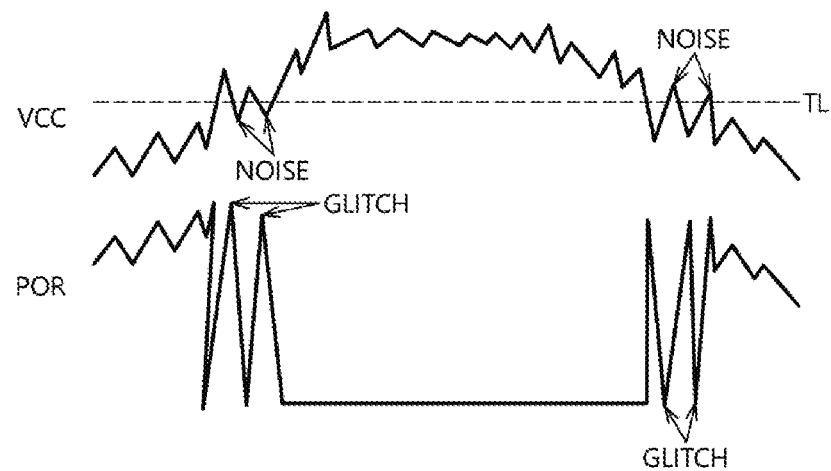
FIG. 3 is a diagram illustrating another operation of the power-on reset signal generating device illustrated in FIG. 1.

FIG. 3 is a diagram schematically illustrating another operation of the power-on reset signal generating device 100 illustrated in FIG. 1. The voltage level of the power supply voltage VCC may change while the power supply voltage VCC is accompanied by a substantially great amount of noise. Particularly, when the power supply voltage VCC rises or falls to a vicinity of the target voltage level, the voltage level of the power supply voltage VCC may repeatedly become higher or lower than the target voltage level TL due to the noise. When the voltage level of the power supply voltage VCC repeatedly becomes higher or lower than the target voltage level TL, a state of the power-on reset signal POR generated from the power-on reset signal generating device 100 may change. That is, even after the power-on reset signal POR becomes enabled, the power-on reset signal POR may repeatedly become enabled or disabled due to the noise of the power supply voltage VCC. Also, even after the power-on reset signal POR becomes disabled, the power-on reset signal POR may repeatedly become enabled or disabled due to the noise of the power supply voltage VCC. The unstable state of the power-on reset signal POR and/or the glitch occurring in the power-on reset signal POR may cause a problem in the reliability of a semiconductor apparatus having the power-on reset signal generating device 100.

Figure 4:
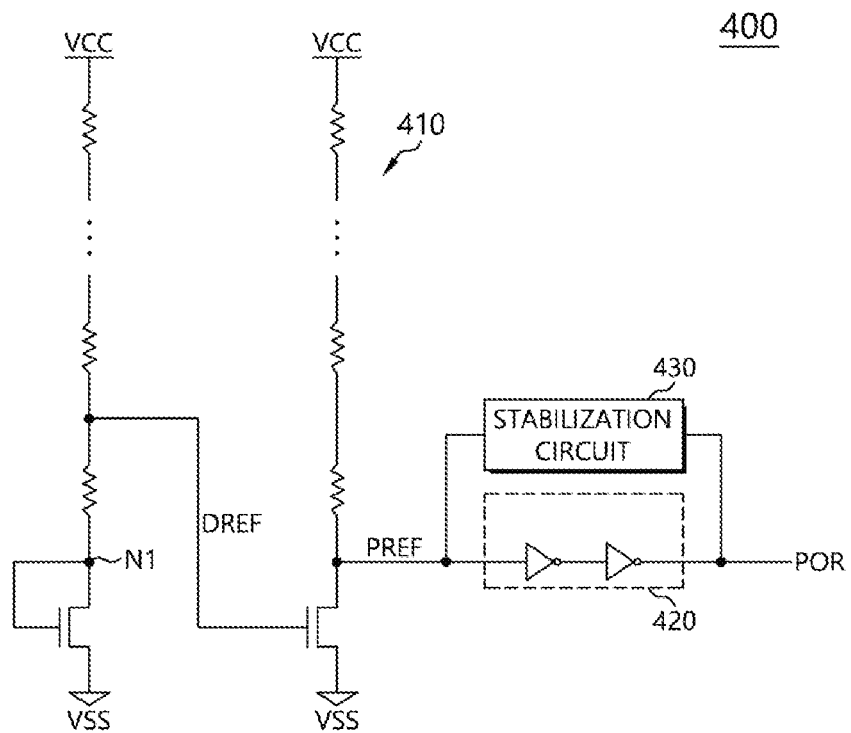
FIG. 4 is a diagram illustrating a configuration of a power-on reset signal generating device in accordance with an embodiment.

FIG. 4 is a diagram illustrating a configuration of a power-on reset signal generating device 400 in accordance with an embodiment. Referring to FIG. 4, the power-on reset signal generating device 400 may include a reference voltage generator 410 and a signal driver 420, which is the same as the power-on reset signal generating device 100 illustrated in FIG. 1, and may further include a stabilization circuit 430. Among the elements configuring the power-on reset signal generating device 400, the same elements as the elements included in the power-on reset signal generating device 100 may be referenced with similar reference numerals and description on the same elements will be omitted. The stabilization circuit 430 may be coupled between an input node and an output node of the signal driver 420. The stabilization circuit 430 may receive the power-on reset signal POR to stabilize the state of the power-on reset signal POR. The power-on reset signal POR may be fed-back to the stabilization circuit 430 and the stabilization circuit 430 may keep the voltage level of the power-on reference voltage PREF maintained, thereby preventing the power-on reset signal POR from unstably changing. When the power-on reset signal POR is enabled, the stabilization circuit 430 may keep the power-on reset signal POR enabled regardless of the voltage level fluctuation of the power supply voltage VCC during a predetermined amount of time. The stabilization circuit 430 may keep the voltage level of the power-on reference voltage PREF maintained during the predetermined amount of time to prevent the power-on reset signal POR from fluctuating to become disabled again. When the power-on reset signal POR becomes disabled, the stabilization circuit 430 may keep the power-on reset signal POR disabled regardless of the voltage level fluctuation of the power supply voltage VCC during the predetermined amount of time. The stabilization circuit 430 may keep the voltage level of the power-on reference voltage PREF maintained during the predetermined amount of time to prevent the power-on reset signal POR from fluctuating to become enabled again. The word "predetermined" as used herein with respect to a parameter, such as a preset period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the power-on reset signal POR becomes enabled to a logic low level, the stabilization circuit 430 may drive the power-on reference voltage PREF to a level of the ground voltage VSS during the predetermined amount of time. Therefore, the power-on reset signal POR may be prevented from fluctuating to become disabled again even when there occurs a noise in the voltage level of the power supply voltage VCC. When the power-on reset signal POR becomes disabled to a logic high level, the stabilization circuit 430 may drive the power-on reference voltage PREF to a level of the power supply voltage VCC during the predetermined amount of time. Therefore, the power-on reset signal POR may be prevented from fluctuating to become enabled again even when there occurs a noise in the voltage level of the power supply voltage VCC.

Figure 5:
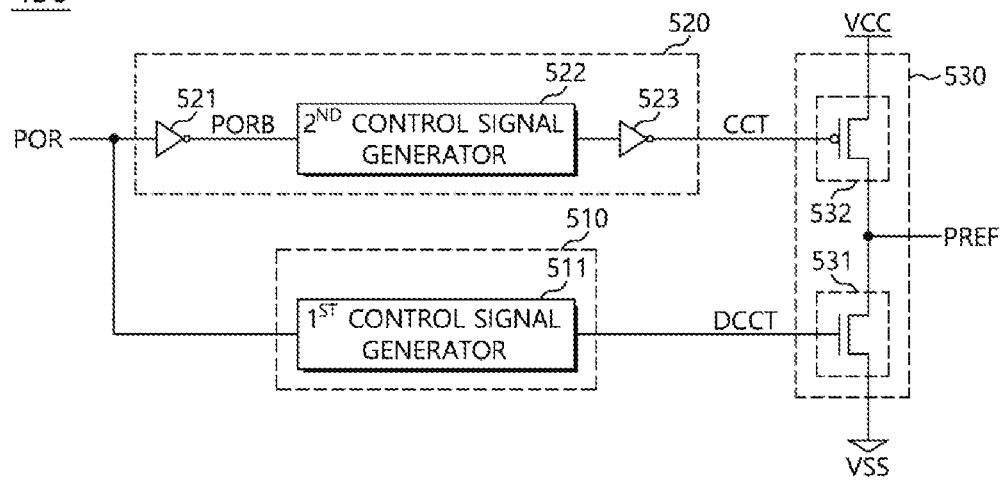
FIG. 5 is a diagram illustrating a configuration of a stabilization circuit illustrated in FIG. 4.

FIG. 5 is a diagram illustrating a configuration of the stabilization circuit 430 illustrated in FIG. 4. Referring to FIG. 5, the stabilization circuit 430 may include a discharge control signal generator 510, a charge control signal generator 520 and a voltage driver 530. The discharge control signal generator 510 may receive the power-on reset signal POR and may generate a discharge control signal DCCT based on the power-on reset signal POR. The discharge control signal generator 510 may enable the discharge control signal DCCT when the power-on reset signal POR is enabled. The charge control signal generator 520 may receive the power-on reset signal POR and may generate a charge control signal CCT based on the power-on reset signal POR. The charge control signal generator 520 may enable the charge control signal CCT when the power-on reset signal POR is disabled. The voltage driver 530 may change the voltage level of the power-on reference voltage PREF based on the discharge control signal DCCT and the charge control signal CCT. The voltage driver 530 may drive the power-on reference voltage PREF to the ground voltage VSS based on the discharge control signal DCCT. The voltage driver 530 may drive the power-on reference voltage PREF to the power supply voltage VCC based on the charge control signal CCT. When the discharge control signal DCCT is enabled, the voltage driver 530 may drive the power-on reference voltage PREF to the ground voltage VSS to lower the voltage level of the power-on reference voltage PREF. When the charge control signal CCT is enabled, the voltage driver 530 may drive the power-on reference voltage PREF to the power supply voltage VCC to raise the voltage level of the power-on reference voltage PREF.

The discharge control signal generator 510 may include a first control signal generator 511. The first control signal generator 511 may generate, when the power-on reset signal POR is enabled, the discharge control signal DCCT, which stays enabled during the predetermined amount of time. The discharge control signal DCCT may stay enabled to a logic high level during the predetermined amount of time. The charge control signal generator 520 may generate, when the power-on reset signal POR is disabled, the charge control signal CCT, which stays enabled during the predetermined amount of time. The charge control signal CCT may stay enabled to a logic low level during the predetermined amount of time. The charge control signal generator 520 may include a first inverter 521, a second control signal generator 522 and a second inverter 523. The first inverter 521 may receive the power-on reset signal POR and may invert the power-on reset signal POR to output a complementary signal PORB of the power-on reset signal POR. The second control signal generator 522 may be substantially the same configuration as the first control signal generator 511 and may operate in substantially the same way as the first control signal generator 511. The second control signal generator 522 may generate, when the power-on reset signal POR is disabled and the complementary signal PORB of the power-on reset signal POR is enabled to a logic low level, a signal, which stays enabled to a logic high level during the predetermined amount of time. The second inverter 523 may invert the signal generated from the second control signal generator 522 to output the charge control signal CCT.

The voltage driver 530 may include a discharge driver 531 and a charge driver 532. The discharge driver 531 may be coupled between the node of the power-on reference voltage PREF and the node, to which the ground voltage VSS is supplied. The discharge driver 531 may receive the discharge control signal DCCT. The discharge driver 531 may drive, when the discharge control signal DCCT is enabled, the node of the power-on reference voltage PREF to the ground voltage VSS. The charge driver 532 may be coupled between the node, to which the power supply voltage VCC is supplied, and the node of the power-on reference voltage PREF. The charge driver 532 may receive the charge control signal CCT. The charge driver 532 may drive, when the charge control signal CCT is enabled, the node of the power-on reference voltage PREF to the power supply voltage VCC.

The discharge driver 531 may include a first transistor. The first transistor may be a N-channel MOS transistor. The first transistor may be coupled to the node of the power-on reference voltage PREF at its drain and may be coupled to the node, to which the ground voltage VSS is supplied, at its source. The first transistor may receive the discharge control signal DCCT at its gate. The charge driver 532 may include a second transistor. The second transistor may be a P-channel MOS transistor. The second transistor may be coupled to the node, to which the power supply voltage VCC is supplied, at its source and may be coupled to the node of the power-on reference voltage PREF at its drain. The second transistor may receive the charge control signal CCT at its gate.

Figure 6:
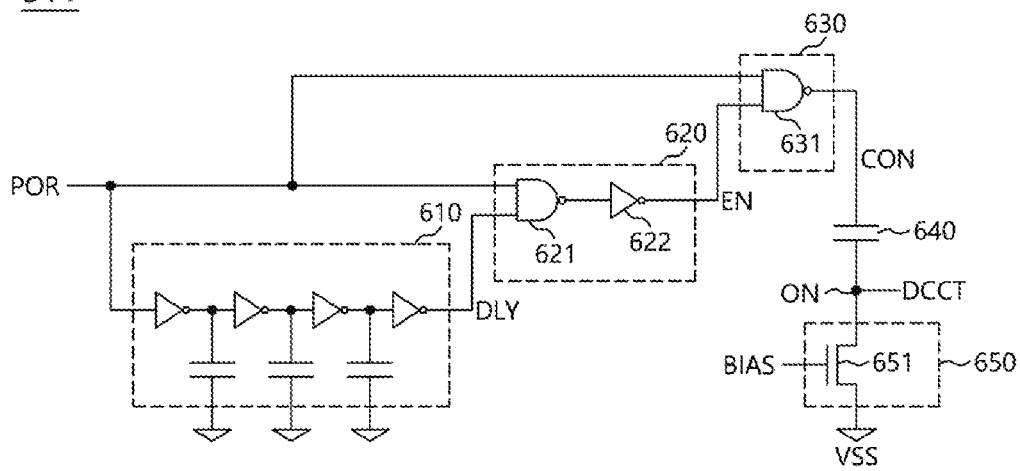
FIG. 6 is a diagram illustrating a configuration of a control signal generator in accordance with an embodiment.

FIG. 6, in accordance with an embodiment, is a diagram illustrating a configuration of the first control signal generator 511 included in the discharge control signal generator 510. Referring to FIG. 6, the first control signal generator 511 may receive the power-on reset signal POR and may generate, when the power-on reset signal POR is enabled, the discharge control signal DCCT, which stays enabled during the predetermined amount of time. The first control signal generator 511 may include a delayer 610, a first gating circuit 620, a second gating circuit 630, a capacitor 640 and a discharger 650. The delayer 610 may delay the power-on reset signal POR to output a delay signal DLY. The delayer 610 may be a non-inversion delayer. For example, the delayer 610 may include four inverters and three capacitors each coupled between neighbouring inverters among the four inverters. The numbers of the inverters and the capacitors included in the delayer 610 will not be limited thereto. The number of the inverters may be even such as two, four or greater and the number of the capacitors may increase or decrease according to the number of the inverters. A delay amount of the delayer 610 may be determined by appropriate numbers of the inverters and the capacitors included in the delayer 610.

The first gating circuit 620 may perform a gating operation on the power-on reset signal POR and the delay signal DLY to generate an enable signal EN. The first gating circuit 620 may perform an AND operation on the power-on reset signal POR and the delay signal DLY to generate the enable signal EN. The first gating circuit 620 may enable, when any one between the power-on reset signal POR and the delay signal DLY becomes of a logic low level, the enable signal EN to a logic low level. The first gating circuit 620 may include a first NAND gate 621 and an inverter 622. The first NAND gate 621 may receive the power-on reset signal POR and the delay signal DLY respectively through its two input nodes. The inverter 622 may be coupled to an output node of the first NAND gate 621. The inverter 622 may invert the output of the first NAND gate 621 to output the enable signal EN. The second gating circuit 630 may perform a gating operation on the power-on reset signal POR and the enable signal EN to generate a control signal CON. The second gating circuit 630 may perform a NAND operation on the power-on reset signal POR and the enable signal EN to generate the control signal CON. The second gating circuit 630 may transition, when any one between the power-on reset signal POR and the enable signal EN is enabled to a logic low level, the control signal CON to a logic high level. The second gating circuit 630 may include a second NAND gate 631. The second NAND gate 631 may receive the power-on reset signal POR and the enable signal EN respectively through its two input nodes. The second NAND gate 631 may output the control signal CON through its output node.

The capacitor 640 may enable the discharge control signal DCCT based on the control signal CON. The capacitor 640 may be charged and may enable the discharge control signal DCCT to a logic high level when the control signal CON is enabled to a logic high level. The capacitor 640 may be coupled to the output node of the second NAND gate 631 at one end and may receive the control signal CON through the one end. The capacitor 640 may be coupled to an output node ON at the other end. The discharge control signal DCCT may be output through the output node ON. The discharger 650 may receive a bias voltage BIAS and may change the voltage level of the discharge control signal DCCT based on the bias voltage BIAS. The discharger 650 may discharge the capacitor 640 to lower the voltage level of the discharge control signal DCCT. The discharger 650 may include a N-channel MOS transistor 651. The N-channel MOS transistor 651 may be coupled to the output node ON at its drain and may be coupled to the node, to which the ground voltage VSS is supplied, at its source. The N-channel MOS transistor 651 may receive the bias voltage BIAS at its gate. The capacitance of the capacitor 640, the size and/or the current-drivability of the N-channel MOS transistor 651 and the voltage level of the bias voltage BIAS may change variously to set the predetermined amount of time. The second control signal generator 522 may have the same configuration as the first control signal generator 511 except that the second control signal generator 522 may receive the complementary signal PORB of the power-on reset signal POR instead of the power-on reset signal POR.

Figure 7:
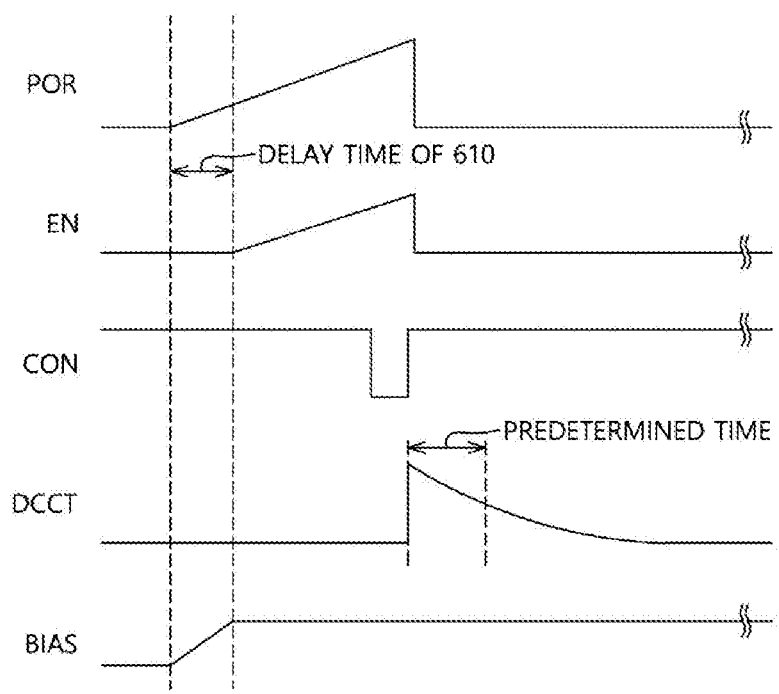
FIG. 7 is a timing diagram illustrating an operation of the control signal generator illustrated in FIG. 6.

FIG. 7 is a timing diagram illustrating an operation of the first control signal generator 511 illustrated in FIGS. 5 and 6. Described hereinafter with reference to FIGS. 5 to 7 will be the operation of the first control signal generator 511. When the power supply voltage VCC is supplied, the voltage levels of the power-on reset signal POR and the bias voltage BIAS may rise. The voltage level of the power-on reset signal POR may correspond to a logic low level yet. The control signal CON output from the second gating circuit 630 may have a logic high level. The delayer 610 may delay the power-on reset signal POR to generate the delay signal DLY even when the voltage level of the power-on reset signal POR rises. Therefore, the voltage level of the delay signal DLY may not rise during a delay time corresponding to the delay amount of the delayer 610. When the delay time corresponding to the delay amount of the delayer 610 elapses, the voltage level of the enable signal EN output from the first gating circuit 620 may rise together with the voltage level of the power-on reset signal POR. When the voltage levels of the power-on reset signal POR and the enable signal EN rise to a logic high level, the second gating circuit 630 may transition the control signal CON to a logic low level. When the voltage level of the power-on reset signal POR keeps rising according to the voltage level of the power supply voltage VCC and the voltage level of the power supply voltage VCC reaches the target voltage level, the power-on reset signal POR may be transitioned to a logic low level. Further, the enable signal EN may be also transitioned to a logic low level and the second gating circuit 630 may transition the control signal CON to a logic high level. When the control signal CON is transitioned to a logic high level, the capacitor 640 may be charged and the discharge control signal DCCT may be enabled. As the discharger 650 discharges the capacitor 640 based on the bias voltage BIAS and the voltage level of the discharge control signal DCCT falls, the discharge control signal DCCT may thereby stay enabled during the predetermined amount of time.

Figure 8:
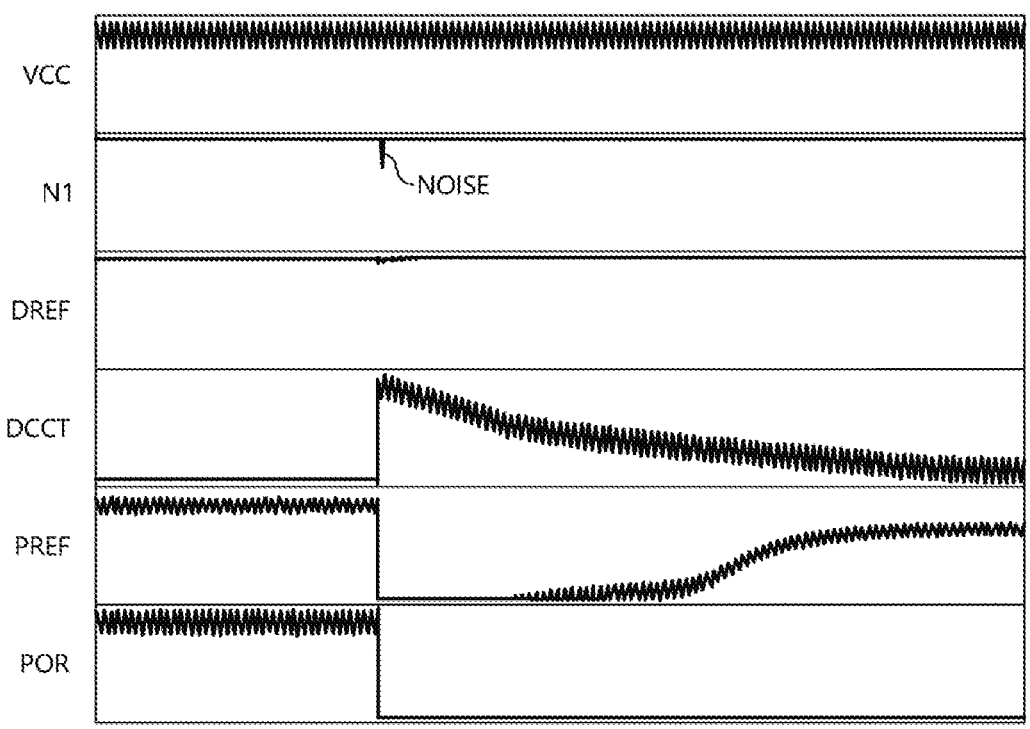
FIG. 8 is a timing diagram illustrating an operation of a power-on reset signal generating device in accordance with an embodiment during a power-up period.
Figure 9:
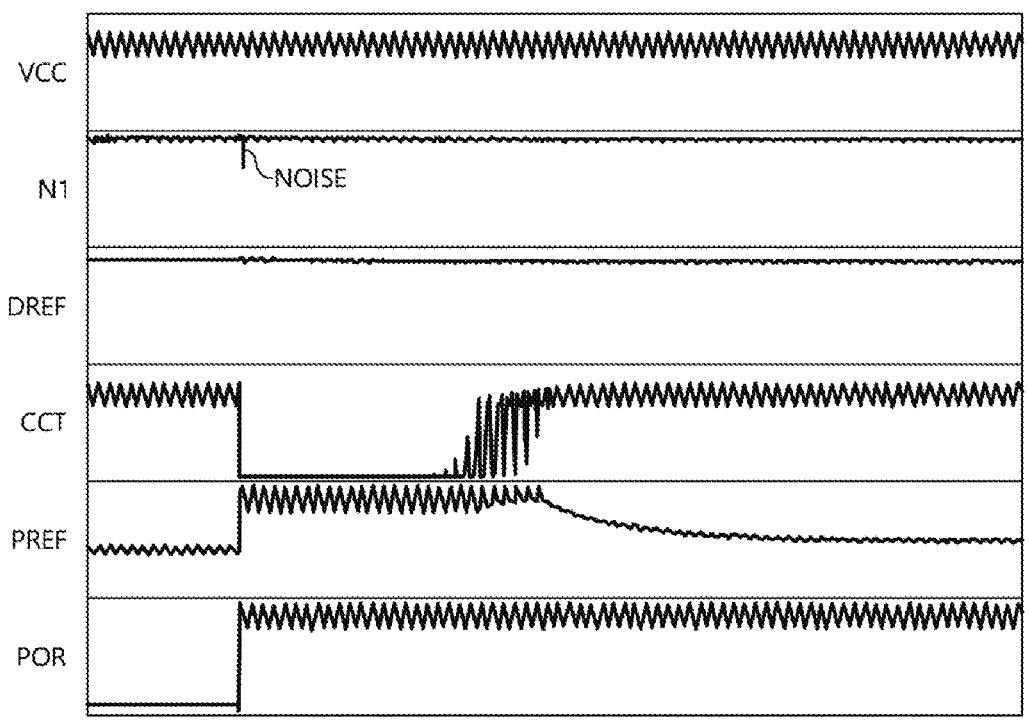
FIG. 9 is a timing diagram illustrating an operation of a power-on reset signal generating device in accordance with an embodiment during a power-down period.

FIG. 8 is a timing diagram illustrating an operation of the power-on reset signal generating device 400 in accordance with an embodiment during a power-up period. FIG. 9 is a timing diagram illustrating an operation of the power-on reset signal generating device 400 in accordance with an embodiment during a power-down period. Described hereinafter with reference to FIGS. 4 to 9 will be the operation of the power-on reset signal generating device 400. FIGS. 8 and 9 are enlarged diagrams illustrating time when the voltage level of the power supply voltage VCC has risen to a vicinity of the target voltage level. Therefore, the power supply voltage VCC may seem to oscillate within a predetermined range. When the voltage level of the power supply voltage VCC rises to reach the target voltage level or a greater voltage level in the power-up period, the power-on reset signal generating device 400 may enable the power-on reset signal POR to a logic low level. When the power-on reset signal POR becomes enabled to a logic low level, the discharge control signal generator 510 may keep the discharge control signal DCCT enabled to a logic high level during the predetermined amount of time. When the discharge control signal DCCT is enabled, the voltage driver 530 may drive the power-on reference voltage PREF to the ground voltage VSS during the predetermined amount of time. There may occur a noise in the power supply voltage VCC and thus the voltage level of the power supply voltage VCC falls under the target voltage level and there may occur a noise at the first node N1. According to a prior art, there occurs a glitch that the enabled power-on reset signal POR fluctuate to become disabled again. However, in accordance with an embodiment of the present disclosure, the power-on reference voltage PREF may be driven to the ground voltage VSS and thus the power-on reset signal POR may be prevented from fluctuating to become disabled again. Therefore, the stabilization circuit 430 may keep, when the power-on reset signal POR is enabled, the power-on reset signal POR enabled regardless of the voltage level fluctuation of the power supply voltage VCC during the predetermined amount of time. When the predetermined amount of time elapses, the voltage level of the power supply voltage VCC rises enough to reach the target voltage level or a greater voltage level and thus there may be no chance for the glitch to occur in the power-on reset signal POR even when there occurs a noise in the power supply voltage VCC.

Referring to FIG. 9, when the voltage level of the power supply voltage VCC falls under the target voltage level in the power-down period, the power-on reset signal generating device 400 may disable the power-on reset signal POR to a logic high level. The first inverter 521 of the charge control signal generator 520 may invert the power-on reset signal POR to output the complementary signal PORB of the power-on reset signal POR, and the second control signal generator 522 may generate the signal having substantially the same waveform as the discharge control signal DCCT illustrated in FIG. 8. The second inverter 523 may invert the signal generated from the second control signal generator 522 to generate the charge control signal CCT. The charge control signal CCT may be enabled to a logic low level when the power-on reset signal POR is disabled and may stay enabled during the predetermined amount of time. When the charge control signal CCT is enabled, the voltage driver 530 may drive the power-on reference voltage PREF to the power supply voltage VCC during the predetermined amount of time. Since the power-on reference voltage PREF is driven to the level of the power supply voltage VCC even when there occurs a noise in the power supply voltage VCC and thus the voltage level of the power supply voltage VCC rises to reach the target voltage level or a greater voltage level, the power-on reset signal POR may be prevented from fluctuating to become enabled again. Therefore, the stabilization circuit 430 may keep, when the power-on reset signal POR is disabled, the power-on reset signal POR disabled regardless of the voltage level fluctuation of the power supply voltage VCC during the predetermined amount of time. When the predetermined amount of time elapses, the voltage level of the power supply voltage VCC falls enough under the target voltage level and thus there may be no chance for the glitch to occur in the power-on reset signal POR even when there occurs a noise in the power supply voltage VCC.

Figure 10:
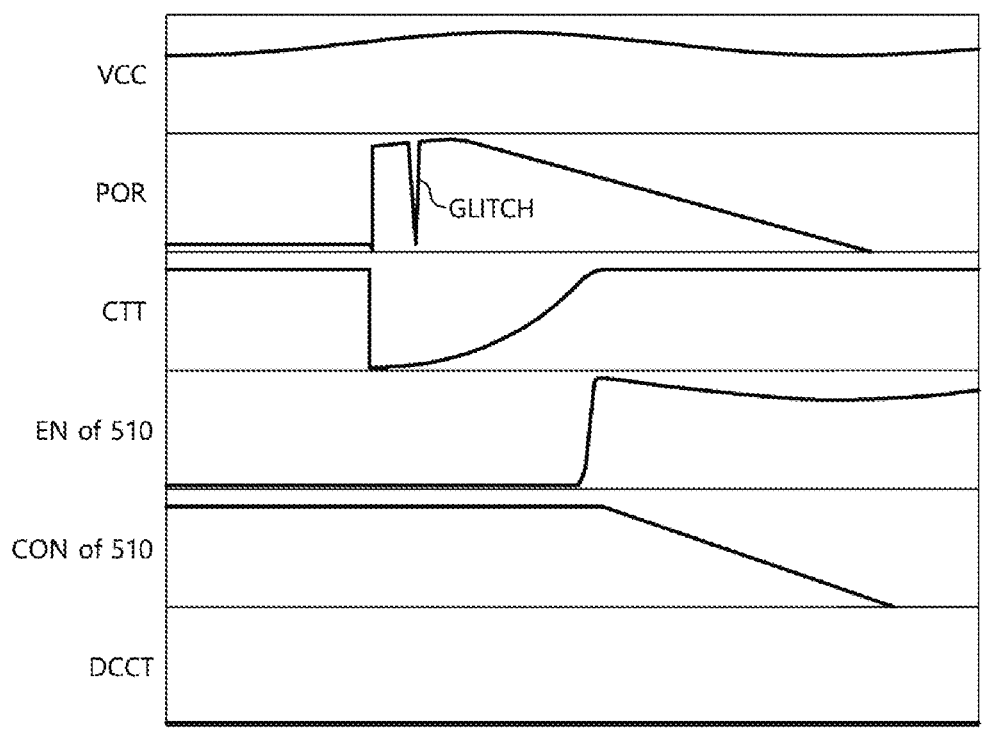
FIG. 10 is a timing diagram illustrating another operation of the stabilization circuit illustrated in FIG. 5 during a power-down period.

FIG. 10 is a timing diagram illustrating another operation of the stabilization circuit 430 illustrated in FIGS. 4 and 5 during the power-down period. Referring to FIG. 10, when the voltage level of the power supply voltage VCC falls under the target voltage level in the power-down period, the power-on reset signal POR may be transitioned to a logic high level. At this time, the stabilization circuit 430 may enable the charge control signal CCT to a logic low level to prevent the glitch from occurring in the power-on reset signal POR. However, even when an unexpected glitch occurs in the power-on reset signal POR, the stabilization circuit 430 may prevent the power-on reference voltage PREF from being driven to the level of the ground voltage VSS. When there occurs the glitch in the power-on reset signal POR, the discharge control signal generator 510 may detect the glitch in the power-on reset signal POR to enable the discharge control signal DCCT and there may occur a malfunction that both of the charge control signal CCT and the discharge control signal DCCT are enabled. However, the first control signal generator 511 having the delayer 610 may prevent both of the charge control signal CCT and the discharge control signal DCCT from being enabled in a period that either one between the charge control signal CCT and the discharge control signal DCCT is enabled. Referring to FIG. 6 together, even when there occurs the glitch in the power-on reset signal POR, the voltage level of the enable signal EN of the discharge control signal generator 510 may keep being maintained during the delay time corresponding to the delay amount of the delayer 610. Therefore, the control signal CON output from the second gating circuit 630 might not be transitioned to a logic low level but may stay to a logic high level, and the discharge control signal DCCT may be fixed to a logic low level and may stay disabled. The stabilization circuit 430 may drive, based on the charge control signal CCT, the power-on reference voltage PREF to the level of the power supply voltage VCC through the charge driver 532. On the contrary, the delayer 610 of the second control signal generator 522 may prevent the charge control signal CCT from being enabled even when there occurs an unexpected glitch in the power-on reset signal POR after the power-on reset signal POR is enabled to a logic low level. Therefore, even when there occurs the glitch in the power-on reset signal POR during the delay time corresponding to the delay amount of the delayer 610, the charge control signal CCT might not be enabled and the stabilization circuit 430 may drive the power-on reference voltage PREF to the level of the ground voltage VSS through the discharge driver 531.

While certain embodiments have been described above, it will be understood to those skilled in the art that the embodiments described are by way of example only. Accordingly, the power-on reset signal generating device should not be limited based on the described embodiments. Rather, the power-on reset signal generating device described herein should only be limited in light of the claims that follow when taken in conjunction with the above description and accompanying drawings.

What is claimed is:

1. A power-on reset signal generating device comprising:
   a reference voltage generator configured to change a voltage level of a power-on reference voltage to a first logic level when a power supply voltage rises to reach a target voltage level or higher voltage level, and configured to change a voltage level of the power-on reference voltage to a second logic level when the power supply voltage falls under the target voltage level;
   a signal driver configured to drive the power-on reference voltage to generate a power-on reset signal;
   a discharge control circuit configured to enable a discharge control signal during a predetermined amount of time when the power-on reset signal is enabled;
   a charge control circuit configured to enable a charge control signal during the predetermined amount of time when the power-on reset signal is disabled; and
   a voltage driver configured to drive the power-on reference voltage to a ground voltage based on the discharge control signal, and to drive the power-on reference voltage to the power supply voltage based on the charge control signal.

2. The power-on reset signal generating device of claim 1, wherein the discharge control signal generator includes a first control signal generator configured to generate the discharge control signal that maintains an enabled state during the predetermined amount of time when the power-on reset signal is enabled.

3. The power-on reset signal generating device of claim 2, wherein the charge control signal generator includes:
   a first inverter configured to invert the power-on reset signal to generate a complementary signal of the power-on reset signal;
   a second control signal generator configured to generate a signal that stays enabled during the predetermined amount of time when the complementary signal of the power-on reset signal is enabled; and
   a second inverter configured to invert the signal output from the second control signal generator to generate the charge control signal.

4. The power-on reset signal generating device of claim 2, wherein the first control signal generator includes:
   a delayer configured to delay the power-on reset signal to generate a delay signal;
   a first gating circuit configured to perform a gating operation on the power-on reset signal and the delay signal to generate an enable signal;
   a second gating circuit configured to perform a gating operation on the power-on reset signal and the enable signal to generate a control signal;

a capacitor configured to be charged and to output the discharge control signal based on the control signal; and a discharger configured to discharge the capacitor to maintain the discharge control signal in an enabled state during the predetermined amount of time.

5. The power-on reset signal generating device of claim 1, wherein the voltage driver includes:

a discharge driver configured to drive a level of the power-on reference voltage to the ground voltage based on the discharge control signal; and a charge driver configured to drive the level of the power-on reference voltage to the power supply voltage based on the charge control signal.

6. A power-on reset signal generating device comprising:

a reference voltage generator configured to generate a power-on reference voltage based on a voltage level of a power supply voltage;

a signal driver configured to drive the power-on reference voltage to generate a power-on reset signal;

a discharge control circuit configured to enable a discharge control signal during a predetermined amount of time when the power-on reset signal is enabled;

a charge control circuit configured to enable a charge control signal during the predetermined amount of time when the power-on reset signal is disabled; and a voltage driver configured to drive the power-on reference voltage to a ground voltage based on the discharge control signal, and to drive the power-on reference voltage to the power supply voltage based on the charge control signal.

7. The power-on reset signal generating device of claim 6, wherein the discharge control signal generator includes a first control signal generator configured to generate the discharge control signal that maintains an enabled state during the predetermined amount of time when the power-on reset signal is enabled.

8. The power-on reset signal generating device of claim 7, wherein the charge control signal generator includes:

a first inverter configured to invert the power-on reset signal to generate a complementary signal of the power-on reset signal;

a second control signal generator configured to generate a signal that stays enabled during the predetermined amount of time when the complementary signal of the power-on reset signal is enabled; and a second inverter configured to invert the signal output from the second control signal generator to generate the charge control signal.

9. The power-on reset signal generating device of claim 7, wherein the first control signal generator includes:

a delayer configured to delay the power-on reset signal to generate a delay signal;

a first gating circuit configured to perform a gating operation on the power-on reset signal and the delay signal to generate an enable signal;

a second gating circuit configured to perform a gating operation on the power-on reset signal and the enable signal to generate a control signal;

a capacitor configured to be charged to output the discharge control signal based on the control signal; and a discharger configured to discharge the capacitor to maintain the discharge control signal in an enabled state during the predetermined amount of time.

10. The power-on reset signal generating device of claim 6, wherein the voltage driver includes:

a discharge driver configured to drive a level of the power-on reference voltage to the ground voltage based on the discharge control signal; and a charge driver configured to drive the level of the power-on reference voltage to the power supply voltage based on the charge control signal.

* * * * *